US011601115B2

United States Patent
Esquius Morote et al.

(10) Patent No.: US 11,601,115 B2
(45) Date of Patent: Mar. 7, 2023

(54) ELECTRONIC RF FILTER

(71) Applicant: RF360 EUROPE GMBH, Munich (DE)

(72) Inventors: Marc Esquius Morote, Munich (DE); Matthias Jungkunz, Munich (DE)

(73) Assignee: RF360 EUROPE GMBH, Munich (DE)

( * ) Notice: Subject to any disclaimer, the term of this patent is extended or adjusted under 35 U.S.C. 154(b) by 122 days.

(21) Appl. No.: 16/967,125

(22) PCT Filed: Feb. 4, 2019

(86) PCT No.: PCT/EP2019/052639
§ 371 (c)(1),
(2) Date: Aug. 3, 2020

(87) PCT Pub. No.: WO2019/158383
PCT Pub. Date: Aug. 22, 2019

(65) Prior Publication Data
US 2020/0395917 A1    Dec. 17, 2020

(30) Foreign Application Priority Data
Feb. 19, 2018    (DE) .......................... 102018103642.6

(51) Int. Cl.
*H03H 9/64*    (2006.01)
*H03H 9/02*    (2006.01)

(52) U.S. Cl.
CPC ...... *H03H 9/6483* (2013.01); *H03H 9/02007* (2013.01); *H03H 9/02535* (2013.01)

(58) Field of Classification Search
CPC ............. H03H 9/6483; H03H 9/02007; H03H 9/02535
See application file for complete search history.

(56) References Cited

U.S. PATENT DOCUMENTS

| 2004/0051601 A1 | 3/2004 | Frank |
| 2016/0218696 A1 | 7/2016 | Nosaka |
| 2017/0134005 A1 | 5/2017 | Takeuchi et al. |

OTHER PUBLICATIONS

International Search Report and Written Opinion dated May 10, 2019, corresponding to Application No. PCT/EP2019/052639.

*Primary Examiner* — Samuel S Outten
(74) *Attorney, Agent, or Firm* — Patterson + Sheridan LLP

(57) ABSTRACT

An electronic filter comprises a high pass section (110) and a low pass section (120). The high pass section includes at least one filter stage of a series-connected acoustic resonator (111) and a parallel connected inductor (114). The low pass section comprises at least one filter stage including a series-connected inductor (121) and a parallel connected acoustic resonator (123). The filter is useful for a communication device covering the n79 5G band.

5 Claims, 2 Drawing Sheets

ELECTRONIC RF FILTER

CROSS-REFERENCE TO RELATED APPLICATIONS

This application is a national stage application under 35 U.S.C. 371 of PCT/EP2019/052639, filed Feb. 4, 2019, which claims the benefit of German Application No. 10 2018 103 642.6, filed Feb. 19, 2018, both of which are incorporated herein by reference in their entireties.

TECHNICAL FIELD

The present disclosure relates to an electronic radio frequency (RF) filter that includes acoustic resonators. The present disclosure also relates to the use of an electronic RF filter in electronic equipment.

BACKGROUND

Electronic filters are used in RF frontends of mobile devices to select the electronic signal in a desired frequency band.

As more and more communication services are established in the spectrum available for mobile communication, the bandwidth and selectivity requirements for RF filters become more challenging. For example, the spectrum for the fifth generation (5G) mobile communication services lies in the sub-6 GHz range that is just below the 5 GHz-WiFi band and above the 4G LTE bands. An RF filter for a 5G service should cover the considerably broad 5G bandwidth with relatively steep skirts to reject the LTE and WiFi bands, especially at the upper end of the 5G frequency bandwidth.

Conventional LC-filters require many LC stages to achieve steep filter skirts so that the physical size of the filter and the insertion loss becomes an issue. Conventional filters based on wave mechanisms such as surface acoustic wave (SAW) resonators or bulk acoustic wave (BAW) resonators are widely used in filters to achieve high skirt steepness. Conventional filters with acoustic resonators often use a ladder-type topology as discussed in Andreas Link and Phil Warder:

"Golden Age for Filter Design", IEEE Microwave Magazine, August 2015, pages 60 to 72, FIG. 3.

The bandwidth achieved with a ladder-type approach is relatively narrow. It could be extended using additional inductors, however, this reduces the rejection level and may introduce additional rejection poles. The filter tends to become complex and sensitive. Furthermore, since the filter passband is realized with acoustic resonators, the power handling capabilities are limited. Therefore, conventional approaches with pure LC-filters or ladder-type acoustic filters may have drawbacks for sub-6 GHz mobile communication services and beyond.

There is a need for an improved topology of RF filters that can handle the high frequencies of the currently established communication services such as 5G, has high selectivity with regard to other communication services and that can handle high transmission power.

An object of the present disclosure is to provide an electronic filter that covers a wide bandwidth, has steep filter skirts and can handle considerable power.

SUMMARY

A filter that addresses the above-mentioned objective comprises a first terminal and a second terminal; a high pass section, the high pass section coupled to one of the first and second terminals, comprising at least one filter stage including a series-connected acoustic resonator and a parallel connected inductor; a low pass section, the low pass section coupled in series with the high pass section and coupled to the other one of the first and second terminals, comprising at least one filter stage including a series-connected inductor and a parallel connected acoustic resonator.

According to an embodiment, an electronic RF filter comprises a high pass section and a low pass section that include one or more stages of an LC-topology. Instead of conventional capacitances, acoustic resonators are used in the series path of the high pass section and in the parallel paths of the low pass section. This concept combines the advantages of a conventional LC filter topology such as high power durability and large bandwidth and the advantages of acoustic resonators such as highly selective acoustic resonances so as to achieve steep filter skirts and the desired rejection levels. In addition, the filter topology becomes very compact since the acoustic resonators act as both capacitances for the bandpass LC filter and acoustic notches.

The topology of the electronic RF filter according to this disclosure can be seen as a bandpass filter with LC characteristic combined with an acoustic band stop filter exploiting the characteristics of acoustic resonators. The acoustic resonators provide two different functions such as the function of a capacitor and the function of a rejection element. The filter is able to handle a wide bandwidth, exhibits steep skirts and is power-durable.

For the present 5G communication standard, the electronic filter according to the present disclosure achieves a high selectivity just above the passband to suppress the 5 GHz-WiFi band. Variations of the design for other fields of mobile communication can also achieve a high selectivity below the passband or a high selectivity even above and below the passband.

The high pass section and the low pass section each comprise at least one or more stages that include a series and a parallel path. Two or more stages can be concatenated in each of the high and low pass sections. In this regard, the high pass section can comprise another, second filter stage with a series-connected acoustic resonator and a parallel connected inductor, wherein the second filter stage is connected in series with the first filter stage. The low pass section can comprise another, second filter stage that includes a series-connected inductor and a parallel connected acoustic resonator, wherein the first and second filter stages are connected in series. The high pass filter section can comprise a third series-connected acoustic resonator that is coupled to the input of the low pass filter section. The acoustic resonator in the first stage of the low pass filter section can be connected to an inductor or a coil coupled to ground potential.

The acoustic resonators may be of any known type, such as surface acoustic wave (SAW) resonators and bulk acoustic wave (BAW) resonators. Depending on the field of application and the target frequencies, the skilled person can choose the appropriate type of SAW or BAW resonator useful for the intended design.

The electronic filter may be dimensioned such that it is configured to provide a passband between 4.4 and 5.0 GHz which is dedicated to the 5G mobile communication service and to provide a rejection between 5.15 and 5.925 GHz which is the 5 GHz-WiFi band. Because both bands are so close to each other, the right skirt of the passband of the 5G filter must be very steep, about 3%, to provide a sufficiently low rejection level to reject cross-talk from the WiFi band into the desired 5G band.

The rejection level may be enhanced with additional stages in the high pass section and/or the low pass section, however, at the cost of more complexity, larger size and more insertion loss. The skilled person is able to determine a suitable solution in terms of passband, rejection level and power durability to achieve a suitable solution for the 5G communication services or even other services in other RF frequency bands.

The above-described electronic RF filter is targeted to a mobile communication device such as a cell phone or a smartphone or any other electronic equipment that includes the capabilities of mobile communication. Specifically, the filter realizes an RF frontend for the send and the receive paths for an RF signal in the frequency range of 4.4 to 5.0 GHz.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
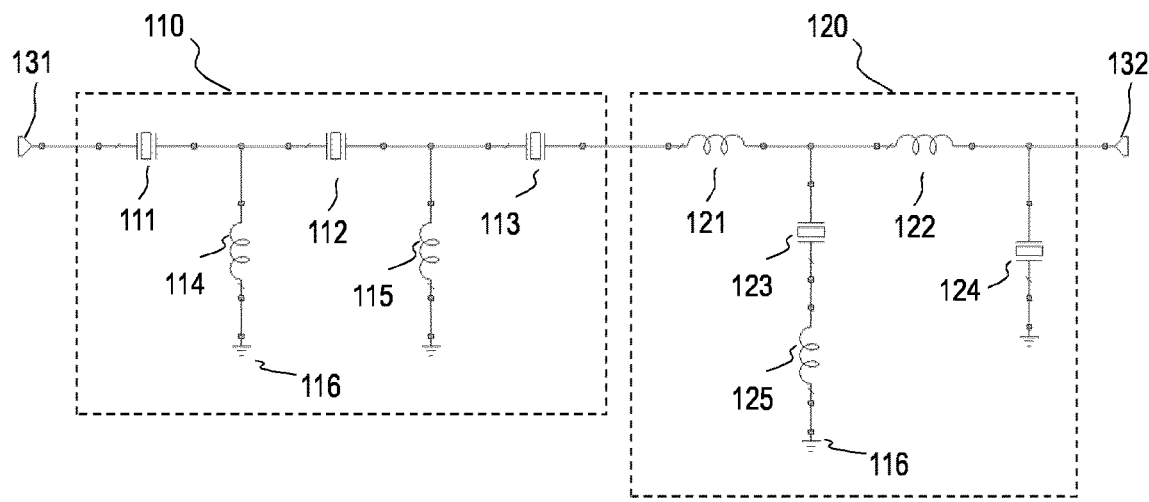
FIG. 1 shows a diagram of an electronic RF filter according to the principles of this disclosure.

FIG. 1 depicts a schematic diagram of a filter according to the principles of this disclosure. The filter may be an RF frontend filter in a mobile communication device such as a smartphone. The filter comprises a first and a second external terminal or port 131, 132 to connect the filter to an antenna and the receive (Rx) and transmit (Tx) circuits of the communication device such as a smartphone. One of ports such as port 131 may be connected to an antenna. The other one of the ports such as port 132 may be connected to the signal processing circuits of the communication device such as the receive and transmit circuits. The filter is composed of a high pass section 110 and a low pass section 120, the high and low pass sections connected in series with each other so that a signal received at the antenna terminal 131 is forwarded to terminal 132 after filtering through high pass section 110 and low pass section 120 and a signal received at terminal 132 is forwarded to antenna terminal 131 after corresponding filtering in low and high pass sections 120, 110.

The high pass section 110 includes several stages comprising a series-connected acoustic resonator 111 and a parallel connected inductor or coil 114. Specifically, the series-connected resonator 111 is connected to the external terminal 131 and another stage 112, 115. The inductor 114 is connected between the acoustic resonator 111 and a terminal for ground potential 116. A second stage of a series-connected resonator 112 and a parallel connected inductor 115 is connected to the first stage. A third stage comprising a series-connected acoustic resonator 113 is connected to the second stage.

The low pass section 120 includes a first stage comprising a series-connected inductor 121 and a parallel connected acoustic resonator 123. The resonator 123 is further connected in series with an inductor 125 which is connected to ground terminal 116. High pass section 120 includes a second stage comprising a series-connected inductor 122 and a parallel connected acoustic resonator 124. The inductor 121 is connected to the resonator 113 of the high pass section. The acoustic resonators 111, 112, 113 and 123, 124 may be surface acoustic wave (SAW) resonators or bulk acoustic wave (BAW) resonators. The filter may comprise one type of resonator, SAW or BAW exclusively or a mixture of both types of resonators.

In other words, the high pass section 110 includes a series connection of resonators 111, 112, 113 of which the nodes between resonators 111, 112 and 112, 113 are connected to ground terminal 116 through respective inductors 114, 115. The low pass section 120 includes a series connection of inductors 121, 122 of which the node between the inductors is connected to ground terminal 116 through a series connection of resonator 123 and inductor 125. The node between inductor 122 and the external terminal 132 is also coupled to ground terminal 116 through resonator 124.

Figure 2:
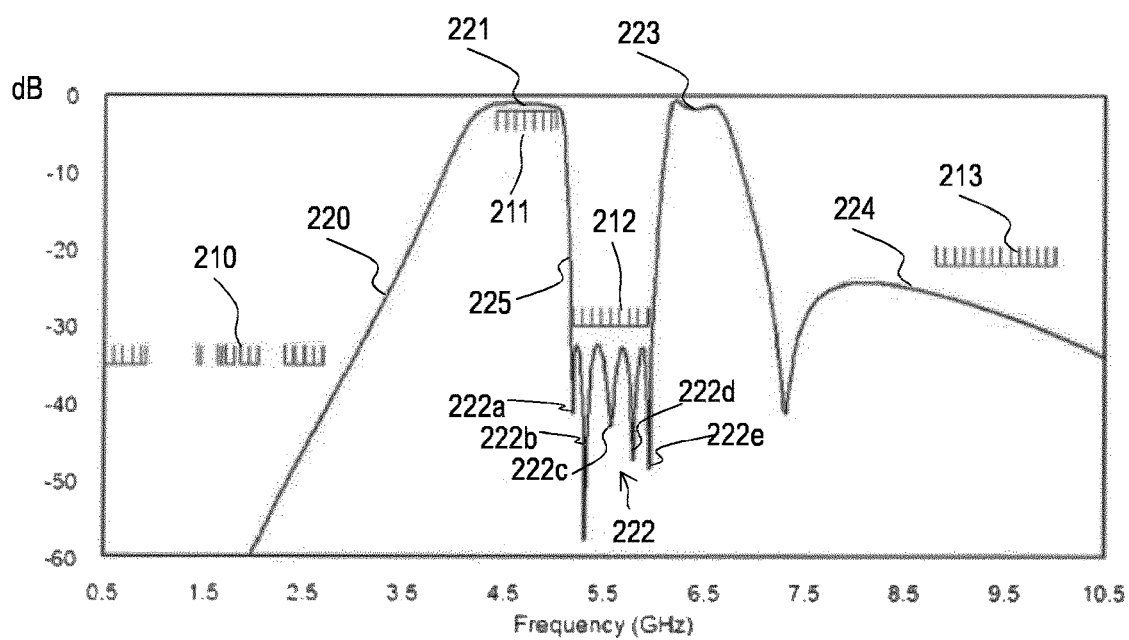
FIG. 2 shows the admittance curve of the filter of FIG. 1.

FIG. 2 shows the admittance curve or transfer curve of the attenuation (dB) over frequency (GHz) that is realized by the filter of FIG. 1. The filter is specifically designed for the 5G communication standard to handle the n79 frequency band 211 and reject other frequency bands of other communication services such as several LTE bands 210 and 5 GHz Wifi band 212 as well as Tx harmonics 213.

The n79 band consists of a frequency band in the range between 4.4 GHz and 5.0 GHz which is about 13% relative bandwidth, shown at 211 in FIG. 2. The filter realizes a passband 221 to cover the n79 band. Close to the right of the n79 band 211 there is the 5 GHz-WiFi band 212 ranging from 5.15 GHz to 5.925 GHz. The n79 filter must suppress the 5 GHz-WiFi band to avoid unwanted cross-talk so that the filter of FIG. 1 requires a sufficient rejection level of stopband 222 immediately to the right of the passband 221. Consequently, the filter must exhibit a steep skirt 225 to the right of the passband 221 relative to the filter central frequency of about 3%. Furthermore, there must be a sufficient rejection level on the left skirt 220 to the left of passband 221 to suppress the LTE bands 210 up to 2.69 GHz. Furthermore, stopband 224 suppresses the harmonics 213 of the Tx modulation. The filter of FIG. 1 must fulfil the following contrary characteristics: broad relative passband 221 for target frequency band 211, steep filter skirt 225 to the right of the passband to suppress frequency band 212, high power handling capability for frequency band 221 Tx operation.

In order to achieve the rejection level 222 for the 5 GHz-WiFi band and the steep skirt 225 of about 3% between passband 221 and rejection level 222, the series resonators 111, 112, 113 of the high pass stage 110 have their resonance frequencies placed at the lower part of the WiFi suppression. The corresponding resonance frequencies generate the peaks 222a, 222b, 222c in the admittance curve. The parallel resonators of the low pass stages 121, 122 are used to cover the upper portion of the 5 GHz-WiFi suppression, shown as peaks 222d, 222e.

The use of acoustic resonators in the disclosed topology achieves benefits as follows. The whole filter passband 221 is created by the LC characteristics of the acoustic resonators. The LC characteristics of the acoustic resonators have high power durability so that they can handle high power, especially high transmission power during a Tx operation. The acoustic characteristics of the acoustic resonators are used to achieve the desired rejection level, where the filter does not need to sustain high power. The filter topology is relatively compact in that only few LC elements and acoustic elements are used. The acoustic resonators act as both capacitances for the bandpass portion with LC characteristic 221 on the one hand, and acoustic notches 222 for the rejection level on the other hand. The filter of FIG. 1 combines the filter functions of a bandpass LC filter with an acoustic band stop filter. The acoustic resonators provide two different functions such as LC filter characteristic and acoustic band stop filter characteristic. This allows the design of a filter suitable for the n79 5G band that includes a passband 221 combined with a high selectivity 222 just above the passband.

Further amending the filter concept according to this disclosure for more specific or additional fields of application, the filter could be amended to also achieve a high selectivity below the passband or even both above and below the passband.

The filter of FIG. 1 combines a wide relative bandwidth of about 13% and a high skirt steepness of about 3%. Conventional filter designs using LC elements could achieve such a steepness only with a huge number of stages leading to a very high order filter so that such a conventional approach would have a large size and generate high insertion losses. Conventional acoustic filters in a conventional ladder-type topology might achieve a high steepness, could achieve only relatively narrow bandwidth, for example, of less than 6%, which is not sufficient for the n79 frequency band. Although the bandwidth of the ladder-type topology could be extended using several additional inductors, however, this would reduce the rejection level and would introduce rejection poles at certain frequencies so that such a conventional approach would be complex and sensitive.

In order to optimize the presently disclosed filter topology of FIG. 1, the filter designer may use a starting point that is an LC filter topology rather than an acoustic ladder-type topology. A conventional bandpass LC filter of few stages is first considered to fulfil as many specifications as possible including the rejections far away from the passband. Then, the capacitances of the different low and high pass stages of the LC topology are replaced by acoustic resonators of the same static capacitance as the original C elements from the starting point of the approach, which leads to the concrete topology shown in FIG. 1. This keeps the same out-of-band filter response as before and introduces the high selective acoustic resonances to achieve the 5 GHz-WiFi suppression. The filter of FIG. 1 is especially applicable in a mobile communication device such as a smartphone to send and/or receive RF signals in the frequency range of 4.4 to 5.0 GHz, because it combines high selectivity and high power handling capability.

Figure 3A:
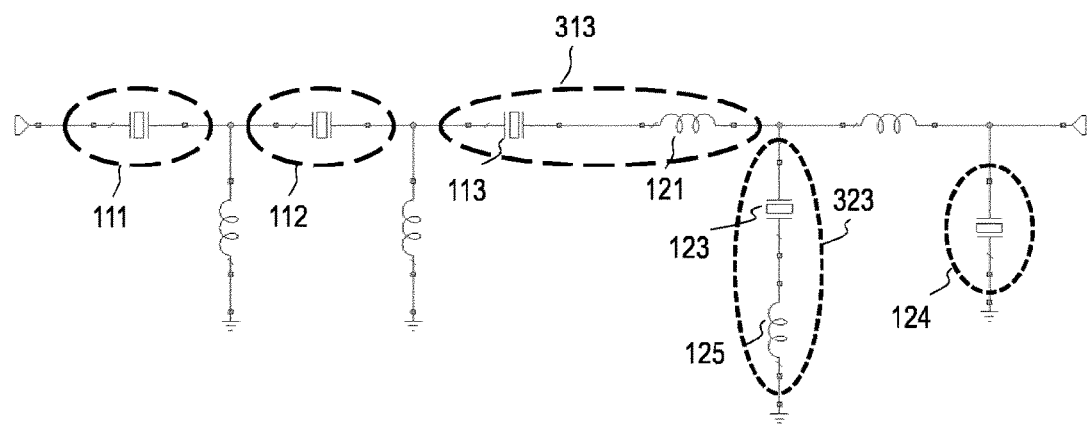
FIGS. 3A and 3B show admittance curves in connection with the acoustic resonators used in the shown filter.
Figure 3B:
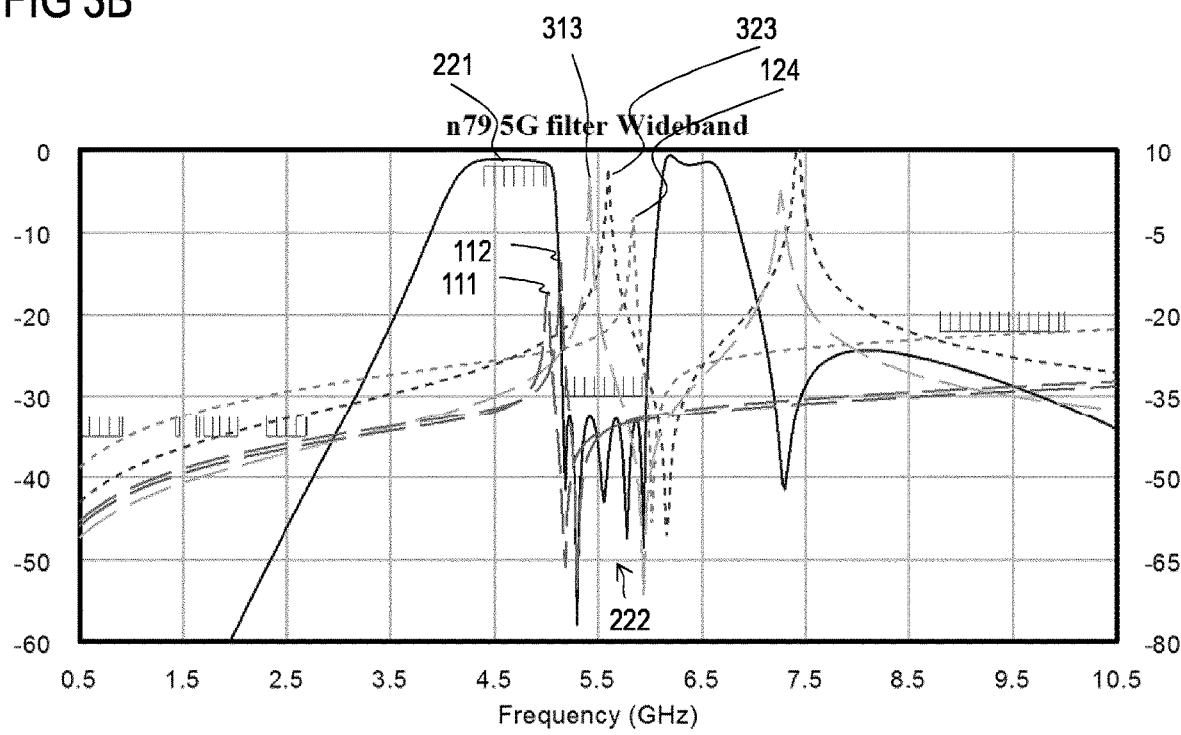

FIG. 3B depicts a composite admittance graph showing the admittance/transfer curve of the filter and the individual admittance curves of the acoustic resonators 111, 112, 113, 123, 124 that are responsible for achieving the passband and the rejection levels as described in connection with FIG. 2. For convenience, the elements and combination of elements of which the RF frequency characteristic is depicted in FIG. 3B are labelled in FIG. 3A. Specifically, the series connection of acoustic resonator 113 and inductor 121, labelled as 313 in FIG. 3A generates admittance curve 313 in FIG. 3B. The series connection of acoustic filter 123 and inductor 125, labelled as 323 in FIG. 3A generates admittance curve 323 in FIG. 3B. The acoustic resonators 111, 112 and 124 of FIG. 3A generate the corresponding admittance curves in FIG. 3B. The combination of these admittance curves achieve the overall transfer characteristic of the filter as shown in FIG. 3B. As can be gathered from FIG. 3B, the lowest suppression peaks of rejection band 222 are caused by elements 111, 112, 313. The highest suppression peaks are caused by elements 323, 124. As can be further gathered from FIG. 3B, the passband 221 is caused by the C characteristic of the acoustic filters which is the portion of the individual admittance curves left of the corresponding resonance frequencies which are those portions with a frequency lower than the resonance frequencies.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. An electronic RF filter, comprising:
a first terminal and a second terminal;
a high pass section, the high pass section coupled to the first terminal, the high pass section comprising:
 a first acoustic resonator, a second acoustic resonator, and a third acoustic resonator connected in series;
 a first inductor coupled to a ground terminal and coupled to a first node located between the first acoustic resonator and the second acoustic resonator; and
 a second inductor coupled to the ground terminal and coupled to a second node located between the second acoustic resonator and the third acoustic resonator; and
a low pass section, the low pass section coupled in series to the high pass section and to the second terminal, the low pass section comprising:
 a third inductor and a fourth inductor connected in series;
 a fourth acoustic resonator coupled to a third node, the third node located between the third inductor and the fourth inductor;
 a fifth inductor coupled to the fourth acoustic resonator and coupled to the ground terminal; and
 a fifth acoustic resonator directly coupled to the ground terminal and coupled to a fourth node located between the fourth inductor and the second terminal.

2. The electronic RF filter according to claim 1, wherein at least one of the acoustic resonators comprises a surface acoustic wave resonator.

3. The electronic RF filter according to claim 1, wherein at least one of the acoustic resonators comprises a bulk acoustic wave resonator.

4. The electronic RF filter according to claim 1, wherein the electronic RF filter is configured to provide a passband between 4.4 and 5.0 GHz and configured to provide a stopband between 5.15 and 5.925 GHz.

5. The electronic RF filter according to claim 1, wherein:
   the electronic RF filter is implemented as a component of a mobile communication device; and
   the mobile communication device is configured to at least one of send or receive an RF signal in the frequency range of 4.4 GHz to 5.0 GHz.

\* \* \* \* \*